(12) United States Patent
Lindner

(10) Patent No.: US 9,622,509 B2
(45) Date of Patent: Apr. 18, 2017

(54) PLASMA PERFORATION

(71) Applicant: TANNPAPIER GMBH, Traun (AT)

(72) Inventor: Michael Lindner, Wartberg ob der Aist (AT)

(73) Assignee: TANNPAPIER GMBH, Traun (AT)

( * ) Notice: Subject to any disclaimer, the term of this patent is extended or adjusted under 35 U.S.C. 154(b) by 0 days.

(21) Appl. No.: 14/783,368

(22) PCT Filed: Apr. 17, 2014

(86) PCT No.: PCT/AT2014/050096
§ 371 (c)(1),
(2) Date: Oct. 8, 2015

(87) PCT Pub. No.: WO2014/169313
PCT Pub. Date: Oct. 23, 2014

(65) Prior Publication Data
US 2016/0058067 A1    Mar. 3, 2016

(30) Foreign Application Priority Data

Apr. 19, 2013  (AT) .............................. A 50268/2013

(51) Int. Cl.
| | |
|---|---|
| A24C 5/00 | (2006.01) |
| H01J 37/32 | (2006.01) |
| B23K 10/00 | (2006.01) |
| B26F 3/16 | (2006.01) |
| A24C 5/56 | (2006.01) |

(52) U.S. Cl.
CPC ................ *A24C 5/007* (2013.01); *A24C 5/56* (2013.01); *B23K 10/00* (2013.01); *B26F 3/16* (2013.01); *H01J 37/32009* (2013.01); *H01J 37/3244* (2013.01); *H01J 2237/334* (2013.01)

(58) Field of Classification Search
None
See application file for complete search history.

(56) References Cited

U.S. PATENT DOCUMENTS

| | | |
|---|---|---|
| 3,475,591 A | 10/1969 | Fujii et al. |
| 4,012,307 A | 3/1977 | Phillips |
| 4,094,324 A | 6/1978 | Bolsinger et al. |
| 4,323,082 A | 4/1982 | Helms et al. |
| 5,092,350 A | 3/1992 | Arthur et al. |

(Continued)

FOREIGN PATENT DOCUMENTS

| | | |
|---|---|---|
| CN | 201350547 | 11/2009 |
| CN | 201801218 | 4/2011 |

(Continued)

OTHER PUBLICATIONS

International Search Report for PCT/AT2014/050096, English translation attached to original, Both completed by the European Patent Office on Sep. 2, 2014, All together 7 Pages.

*Primary Examiner* — Shamim Ahmed

(74) *Attorney, Agent, or Firm* — Brooks Kushman P.C.

(57) ABSTRACT

A method and device for the plasma perforation of tipping paper, wherein a low temperature plasma is generated on the surface of the tipping paper by briefly ionizing a gas mixture using an energy source that is as close in form to a point as possible, wherein the ionizable gas mixture is locally restricted to a very small surface region of the tipping paper.

18 Claims, 3 Drawing Sheets

(56) References Cited

U.S. PATENT DOCUMENTS

Figure 1:
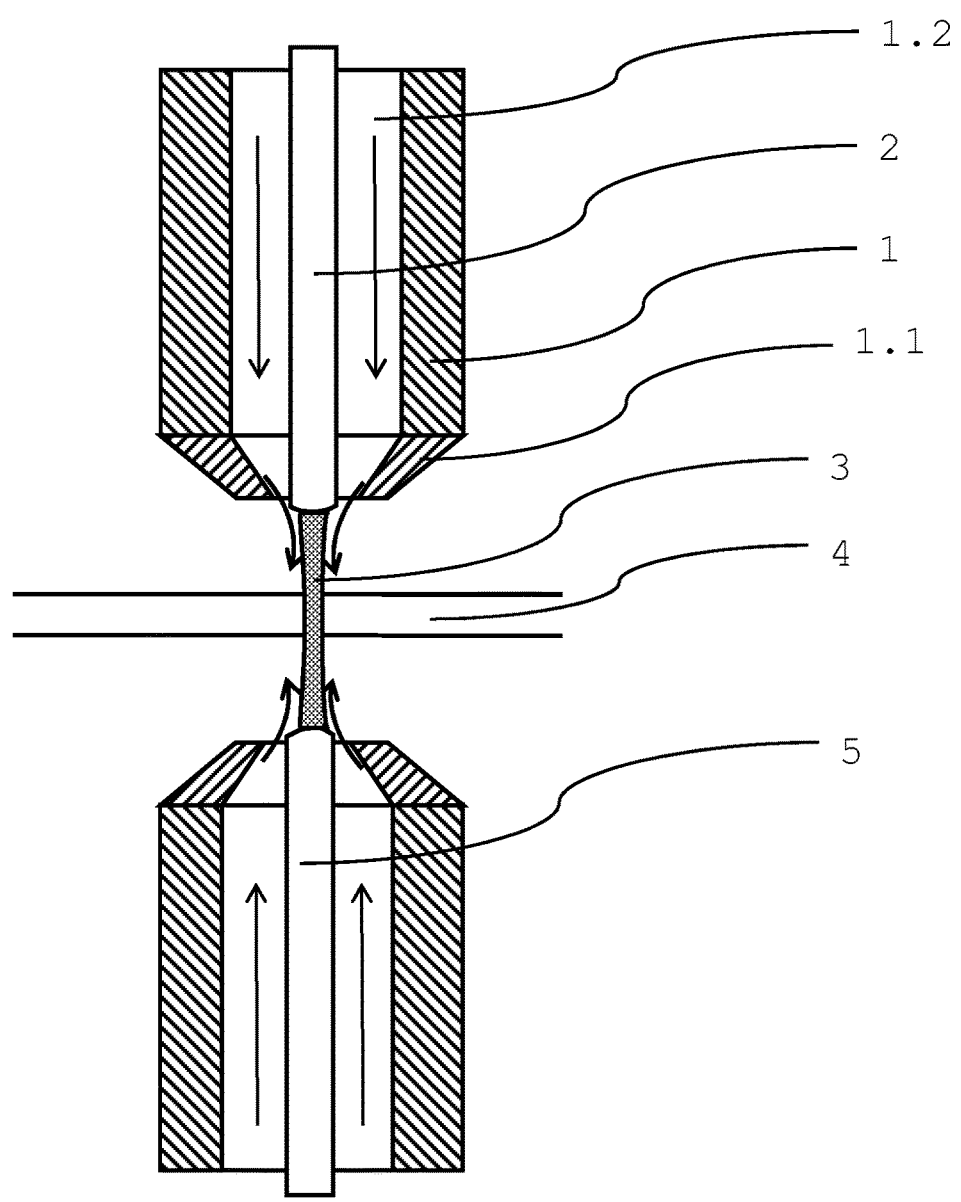

| | | | |
|---|---|---|---|
| 5,322,985 A | 6/1994 | Ohba et al. | |
| 2005/0035093 A1 | 2/2005 | Yamaguchi et al. | |
| 2010/0196224 A1* | 8/2010 | Takahashi | B01J 19/088 422/186.21 |
| 2010/0239472 A1* | 9/2010 | Mizuno | B01J 19/088 422/186.04 |
| 2012/0187841 A1* | 7/2012 | Kindel | A61B 18/042 315/111.21 |
| 2013/0213467 A1* | 8/2013 | Nattermann | B26F 1/28 136/256 |

FOREIGN PATENT DOCUMENTS

| | | |
|---|---|---|
| DE | 2751522 | 8/1978 |
| DE | 2934045 | 3/1981 |
| DE | 3016622 | 11/1981 |
| DE | 102004001327 | 8/2005 |
| EP | 0222973 | 5/1987 |
| EP | 0257766 | 3/1988 |
| EP | 0565341 | 10/1993 |
| GB | 2055669 | 3/1981 |
| JP | 2001001154 | 1/2001 |
| WO | 0183149 | 11/2001 |

* cited by examiner

PLASMA PERFORATION

CROSS-REFERENCE TO RELATED APPLICATION

This application is the U.S. national phase of PCT Application No. PCT/AT2014/050096 filed on Apr. 17, 2014, which claims priority to AT Patent Application No. 50268/2013 filed on Apr. 19, 2013, the disclosures of which are incorporated in their entirety by reference herein.

The invention relates to a method for the plasma perforation of tipping paper and to a device for plasma perforation.

Five main parts of a conventional filter cigarette are the tobacco rod, the cigarette paper enclosing it, the filter, the filter wrapping paper and the tipping paper (mouthpiece covering paper).

The mouthpiece covering paper, often also referred to as "tipping paper" or "tipping" for short, encloses the filter and the filter wrapping paper. It is the part of the filter cigarette that is touched by the lips of the person smoking the cigarette when the filter cigarette is being smoked. In the longitudinal direction of the filter cigarette, the tipping paper also generally protrudes slightly into the region along the length of the tobacco rod, where it encloses the cigarette paper and is connected to it by an adhesive bond. By establishing this adhesive bond, the filter part and the tobacco rod part are mechanically connected in the cigarette making machine. The tipping paper is usually in fact a paper; it may for example be a film or a foil. In the case where the tipping paper is formed as film or foil, it may for example consist of cellulose hydrate.

The tipping paper usually bears a visually attractive print. This print often resembles cork.

At the end near the tobacco rod, the tipping paper is usually of a partly perforated form, so that, when the cigarette is puffed, air from the surroundings enters the filter and mixes there with the stream of smoke coming from the tobacco rod, whereby the smoke values are advantageously altered.

The tipping paper is generally perforated after being printed, in order to prevent the perforation holes from being closed again by the printing.

According to the prior art, three methods are used for the perforation of paper, paper webs or other materials.
  Mechanical perforation
  Laser perforation
  Electro-perforation In the case of mechanical perforation, sharp pins or pincushions are used, piercing the tipping paper. Such a method is described in EP 0222973 A1 for the perforation of the filter wrapping paper. The average diameter of the air through-openings (hole size) in the case of this method is between approximately 0.05 and approximately 0.4 mm. It is disadvantageous that the pins are subject to mechanical wear, and therefore the hole size is subject to fluctuations, or to achieve constant hole sizes the pins would have to be frequently exchanged.

In the case of laser perforation, the paper is perforated by a concentrated light beam. Such a method is described for example in DE 2751522 A1 and in DE 102004001327 A1. The hole size corresponds approximately to that of mechanical perforation; therefore, holes from a diameter of 0.05 mm can be produced. It is advantageous in comparison with mechanical perforation that no wear of the device takes place and the hole diameters and hole positions can be set very accurately. It is disadvantageous that no holes with a diameter below 0.05 mm can be produced.

In the case of electro-perforation, also known as electrostatic perforation, the paper is perforated by burning, in that an electrical spark discharge passes through the paper. This involves using needle-shaped electrodes, which are arranged on one side of the paper web. On the other side there is a flat-formed counter electrode, or once again a number of needle electrodes. The needle electrodes and the counter electrodes are separated by the paper web and a narrow air gap. Application of a high voltage to the electrodes causes a discharge through the air gap and the paper web. The high thermal energy of the spark discharge has the effect that the paper web burns over a small area and a hole forms. It is advantageous that very small holes, with a diameter of 0.01 mm, can be produced. It is disadvantageous that the burning causes visible traces to occur at the edges of the holes (burnt edges), that the difficult-to-control discharge causes a wide variation in the sizes of the holes and that creeping discharges cause scattered sparks, which additionally create tiny holes around the desired perforation holes. Examples of electro-perforation are shown in DE3016622 (A1), U.S. Pat. No. 4,094,324 (A) and in DE2934045 (A1).

The object on which the invention is based is that of providing a method that is capable of producing small hole sizes from 0.01 mm while avoiding the disadvantages of electro-perforation.

To achieve the object, it is proposed to bring about the perforation of the tipping paper by generating a low-temperature plasma with special properties.

The challenge of the present invention is to generate a controlled, reproducible low-temperature plasma, since this is the only way to achieve the effect that an exact hole size and hole position is produced in the tipping paper. Plasma is generated by ionizing a gas or gas mixture. Apart from the energy supplied and the prevailing pressure, especially the gas or the composition of the ionized gas mixture is decisive for the degree of ionization and the temperature of the plasma.

If a solid material is brought into contact with the low-temperature plasma, two effects occur at its surface, that is sublimation and oxidation. Sublimation is the direct transformation of matter from the solid state into the gaseous state. Oxidation is a chemical reaction with the emission of electrons of a chemical substance. The oxidation of a chemical substance with oxygen can be observed with flame formation as burning. Oxidation has the effect of changing the starting substances and creating new chemical compounds.

If the low-temperature plasma is generated in the gas mixture adjacent to the surface of tipping paper, the two effects mentioned have the result that a hole forms in the region of the low-temperature plasma. The effect of sublimation is to be preferred here over the effect of oxidation (burning), since oxidation can lead to undesired combustion products, which, depending on the composition of the starting substances, may also have a toxic effect. Combustion products may be visible in the form of combustion residues, which may detract from the visual impression and under some circumstances change the taste of a cigarette. In the case of sublimation, the solid substances of the tipping paper evaporate without any residue. Therefore, in the case of the present invention, a low-temperature plasma is generated and its properties are controlled such that the process of sublimation takes place almost exclusively.

This is technically implemented by introducing a defined gas mixture or a specific gas at a locally limited surface region of the tipping paper and ionizing this gas by a concentrated supply of energy over a limited time. The fact that the gas mixture and the supplied energy only meet one another locally in a very limited region achieves the effect that the low-temperature plasma is only generated in this small region, and therefore only comes into contact with a very small region of the surface of the tipping paper. This results in a small hole size and a high positional accuracy of the hole.

The present invention is advantageous in comparison with the prior art because very small hole diameters can be achieved in comparison with laser perforation and mechanical perforation and because a very exact hole size and exact hole position can be achieved in comparison with electrical perforation. It is additionally advantageous in comparison with electro-perforation that visible combustion traces at the edges of the holes are avoided.

The invention is illustrated on the basis of drawings:

FIG. 1: shows an example of a device according to the invention in a sectional view.

Figure 2:
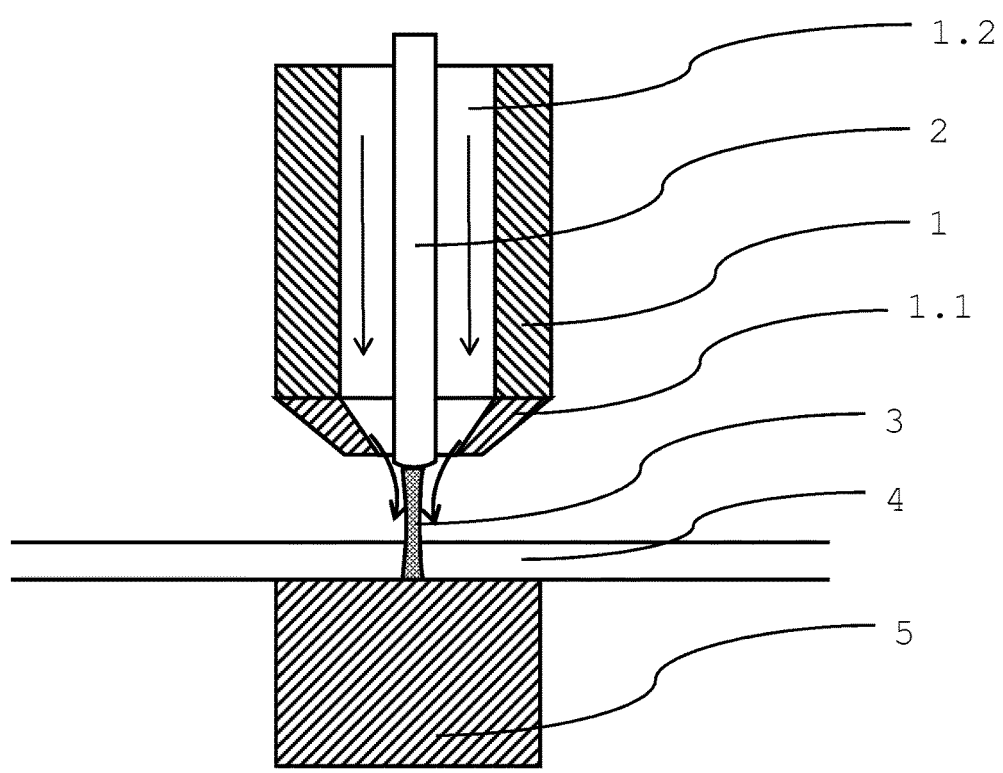

FIG. 2: shows a second example of a device according to the invention in a sectional view.

Figure 3:
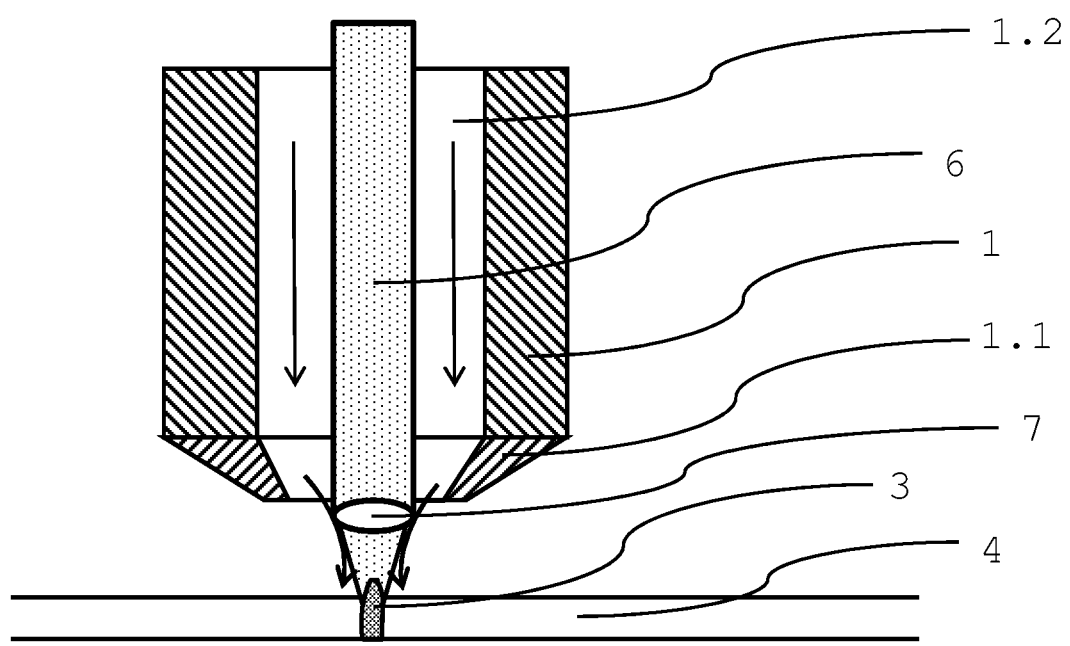

FIG. 3: shows an example of a device according to the invention in which a laser beam serves as the energy source.

In FIG. 1, a device according to the invention for the plasma perforation of a paper web, in particular a tipping paper web or tipping paper 4, is represented. An energy source with as small an area as possible is arranged on at least one flat-formed side of the tipping paper 4. In this example, a needle-shaped electrode 2 is used as the energy source, to be more exact the application of a voltage between two electrodes 2, 5. The electrode 2 is fitted in a tube 1. The tube 1 serves for transporting a pressurized gas or gas mixture. For better understanding, the gas stream is illustrated in the figures by arrows. At the front end of the tube 1 there is a nozzle 1.1 for constricting the gas stream. This nozzle 1.1 is fitted concentrically around the electrode 2 in the region of the tip of the latter that is facing the tipping paper 4. Therefore, a pressurized gas or gas mixture is introduced annularly around the electrode 2 in the direction of the tipping paper 4 through the hollow space 1.2 enclosed by the tube 1 and the nozzle 1.1. On the other side of the tipping paper 4 there may be a similarly formed needle-shaped counter electrode 5 or, as shown in FIG. 2, a flat-formed counter electrode 5.

The introduction of an inert gas or a gas mixture with a high inert gas concentration through the hollow space 1.2 means that a narrow region with a different gas composition remains in the middle of this gas stream, that is to say directly in front of the tip of the electrode 2 toward the tipping paper 4. In this region, the concentration of inert gas is somewhat lower than in the direct stream from the nozzle 1.1. As a result, in this region it is more easily possible to ionize the gas, and thus to generate a locally limited plasma 3, which finally generates a hole in the tipping paper 4 by sublimation. Since there is already a high concentration of inert gas in, and particularly around, the plasma 3, oxidation at the surface of the tipping paper 4 is prevented, whereby visible traces of burning at the edge of the hole are avoided. The extent of the region with a lower inert gas concentration, and consequently of the plasma 3, can be increased or reduced by a narrower or somewhat wider configuration of the nozzle 1.1 or by changing the distance by which the electrode 2 protrudes from the nozzle 1.1. The best-possible configuration of the device and the ideal inert gas or gas mixture can best be determined by trial and error, since these depend on the nature of the material to be perforated, in particular tipping paper 4.

FIG. 3 shows the method according to the invention with a laser beam 6 as the energy source. Once again, a nozzle 1.1 is arranged at the lower end of the tube 1. In this nozzle there is centrally a lens 7, which performs two tasks. The lens 7 firstly serves for focusing the laser beam 6 onto the surface of the tipping paper. The lens 7 secondly serves for influencing the gas stream from the nozzle 1.1 in the desired way, to be precise in such a way that the gas stream takes place annularly around the lens 7. In order that the inert gas or gas mixture can flow out around the lens 7, it is for example fixed in the tube 1 by thin wires, or is located at the end of a rigid optical waveguide which, like the electrode 2, extends vertically in the tube 2. The plasma 3 is in this case restricted to the region in which the energy density of the laser beam 6 is high enough to ionize the gas mixture with a sufficiently low inert gas concentration. At the focal point of the lens 7, the energy density of the laser beam 6 is at the highest and the inert gas concentration is also at the lowest, and therefore a local, small-area plasma 3 can be produced.

Nitrogen ($N_2$), argon (Ar), or carbon dioxide ($CO_2$) may be used for example as the inert gas. Since the inert gas or gas mixture leaves the nozzle 1.1 under pressure, the density of the gas or the gas mixture is higher in the annular region around the electrode 2 or lens 7 than in the region just in front of the electrode 2 or lens 7. The denser a gas is, the more energy is required to ionize it. In addition, ions and electrons are flushed away by the gas stream. These two effects also contribute to the plasma 3 being locally limited. In particular in the application with the laser beam 6 as the energy source, compressed air may be sufficient as the gas mixture, since in the case of the laser-generated plasma 3 the effect of sublimation predominates over oxidation.

The invention claimed is:

1. A method for the plasma perforation of tipping paper, comprising generating a plasma at a surface of a tipping paper by a gas mixture being ionized for a short time by an energy source that is as far as possible in point form, wherein an ionizable gas mixture is locally restricted to a very small surface region of the tipping paper, wherein the ionizable gas mixture is surrounded by inert gas or a gas mixture with a high inert gas concentration that cannot be ionized by the energy source, wherein high inert gas concentration refers to an inert gas concentration that is higher than the inert gas concentration of the ionizable gas mixture.

2. The method as claimed in claim 1, wherein a pressurized inert gas or a pressurized gas mixture comprising inert gas is introduced annularly around the energy source in a direction of the tipping paper.

3. The method as claimed in claim 1, wherein the energy source is formed by two spaced-apart electrodes, the tipping paper and the ionizable gas mixture being located in gap between the two electrodes and the ionizable gas mixture being ionized by applying a voltage between the electrodes.

4. The method as claimed in claim 3, wherein at least one of the electrodes has a tip that faces the tipping paper, wherein said electrode is located in a tube which has an outlet opening that faces the tipping paper and a pressurized inert gas or a pressurized gas mixture comprising inert gas is introduced annularly around the tip of the electrode through said outlet opening of the tub.

5. The method as claimed in claim 3, wherein each electrode has a tip that faces the tipping paper, wherein each electrode is located in a tube, each tube has an outlet opening that faces the tipping paper and a pressurized inert gas or a pressurized gas mixture comprising inert gas is introduced annularly around a tip of each electrode through said outlet opening of each tube.

6. The method as claimed in claim 1, wherein the energy source is a laser beam, which is directed at the tipping paper from one side, and in that the ionizable gas or gas mixture is located in the laser beam and is ionized by it.

7. The method as claimed in claim 6, wherein the laser beam is focused onto the ionizable gas mixture by a lens.

8. The method as claimed in claim 2, wherein said energy source has a tip from which an energy beam is directed onto the tipping paper, wherein this energy source is provided in a tube, arranged at the end of which that is facing the tipping paper is a nozzle, which serves as an outlet opening for said pressurized inert gas or said pressurized gas mixture comprising inert gas, the tip of the energy source being arranged concentrically in the nozzle.

9. The method as claimed in claim 8, wherein the tip of the energy source protrudes from the nozzle of the tube in the direction of the tipping paper.

10. A method for the plasma perforation of tipping paper, comprising generating a plasma at the surface of a tipping paper by a gas mixture being ionized for a short time by an energy source that is as far as possible in point form, wherein an ionizable gas mixture is locally restricted to a very small surface region of the tipping paper by introducing a pressurized inert gas or a pressurized gas mixture with high inert gas concentration annularly around the energy source in the direction of the tipping paper, wherein high inert gas concentration refers to an inert gas concentration that is higher than the inert gas concentration of the ionizable gas mixture.

11. The method as claimed in claim 10, wherein the energy source is formed by two spaced-apart electrodes, the tipping paper and the ionizable gas mixture being located in the gap between the two electrodes and the ionizable gas mixture being ionized by applying a voltage between the electrodes.

12. The method as claimed in claim 11, wherein at least one of the electrodes has a tip that faces the tipping paper, wherein said electrode is located in a tube which has an outlet opening that faces the tipping paper and said pressurized inert gas or a said pressurized gas mixture with high inert gas concentration is introduced annularly around the tip of the electrode through said outlet opening of the tube.

13. The method as claimed in claim 12, wherein the tip of the electrode protrudes from the outlet opening of the tube in the direction of the tipping paper.

14. The method as claimed in claim 10, wherein the energy source is a laser beam, which is directed at the tipping paper from one side, and in that the ionizable gas or gas mixture is located in the laser beam and is ionized by it.

15. A method for the plasma perforation of tipping paper, comprising generating a plasma being at the surface of the tipping paper by a gas mixture being ionized for a short time by an energy source that is as far as possible in point form, wherein an ionizable gas mixture is locally restricted to a very small surface region of the tipping paper, wherein the energy source is a laser beam, which is directed at the tipping paper from one side, and wherein the ionizable gas or gas mixture is located in the laser beam and is ionized by it, wherein the laser beam is focused onto the ionizable gas mixture by a lens.

16. The method as claimed in claim 15, wherein a pressurized inert gas or a pressurized gas mixture with a high inert gas concentration is introduced annularly around the lens in the direction of the tipping paper, wherein high inert gas concentration refers to an inert gas concentration that is higher than the inert gas concentration of the ionizable gas mixture.

17. The method as claimed in claim 16, wherein said lens is provided in a tube, arranged at the end of which that is facing the tipping paper is a nozzle, which serves as an outlet opening for said pressurized inert gas or said pressurized gas mixture with a high inert gas concentration, the lens being arranged concentrically in the nozzle.

18. The method as claimed in claim 17, wherein the lens protrudes from the nozzle of the tube in the direction of the tipping paper.

* * * * *